United States Patent
Ferguson

(10) Patent No.: US 11,847,455 B2
(45) Date of Patent: Dec. 19, 2023

(54) CLEARING REGISTER DATA USING A WRITE ENABLE SIGNAL

(71) Applicant: Graphcore Limited, Bristol (GB)

(72) Inventor: Jonathan Louis Ferguson, Bristol (GB)

(73) Assignee: GRAPHCORE LIMITED, Bristol (GB)

( * ) Notice: Subject to any disclaimer, the term of this patent is extended or adjusted under 35 U.S.C. 154(b) by 50 days.

(21) Appl. No.: 17/345,186

(22) Filed: Jun. 11, 2021

(65) Prior Publication Data

US 2022/0019437 A1    Jan. 20, 2022

(30) Foreign Application Priority Data

Jul. 14, 2020   (GB) ...................... 2010808

(51) Int. Cl.
    *G06F 9/30*       (2018.01)
    *G06F 15/78*      (2006.01)

(52) U.S. Cl.
    CPC ........ *G06F 9/30141* (2013.01); *G06F 9/3016* (2013.01); *G06F 15/7807* (2013.01)

(58) Field of Classification Search
    CPC ............. G06F 9/30141; G06F 9/30098; G06F 9/30105; G06F 9/3016; G06F 9/3877
    See application file for complete search history.

(56) References Cited

U.S. PATENT DOCUMENTS

| | | | |
|---|---|---|---|
| 4,004,280 A | | 1/1977 | Vandierendonck |
| 5,533,185 A | * | 7/1996 | Lentz .................. G06F 9/30043 345/658 |
| 2004/0060015 A1 | * | 3/2004 | Mochizuki .......... G06F 9/30141 716/117 |
| 2010/0199072 A1 | * | 8/2010 | Craske ................ G06F 9/30141 712/218 |
| 2019/0205061 A1 | * | 7/2019 | Weissmann ........... G06F 3/0659 |

OTHER PUBLICATIONS

Combined Search and Examination Report dated Apr. 8, 2021 for United Kingdom Patent Application No. GB2010808.0. 12 pages.

* cited by examiner

*Primary Examiner* — Jyoti Mehta
*Assistant Examiner* — Kasim Alli
(74) *Attorney, Agent, or Firm* — HAYNES AND BOONE LLP

(57) ABSTRACT

A processing unit having a register file includes: a plurality of registers each having a write enable input configured to receive a write enable signal and a write data input connected to a write data path of the processing unit and configured to write data values from the write data path for storage in a register when the write enable signal is asserted; write circuitry configured in a normal mode of operation to assert the write enable signal of a respective one of the registers to cause operational data values to be written to that register from the write data path; and data cleansing circuitry configured to control a data cleansing mode in which write enable signals of all registers in the register file are simultaneously asserted to cause cleansing data values to be simultaneously written to all registers in the register file from the write data path.

9 Claims, 5 Drawing Sheets

CLEARING REGISTER DATA USING A WRITE ENABLE SIGNAL

CROSS-REFERENCE TO RELATED APPLICATIONS

The present application claims priority to United Kingdom Patent Application No. 2010808.0, filed on Jul. 14, 2020, the disclosure of which is hereby incorporated herein by reference in its entirety.

TECHNICAL FIELD

The present disclosure relates to clearing data from registers in a processor.

BACKGROUND

In the context of processing data of complex or high-volume applications, a work accelerator may be a subsystem to which processing of certain data is offloaded from a host system. Such a work accelerator may have specialised hardware for performing specific types of processing. The characteristic of such a work accelerator is that it is configured to operate at a high work rate, that is to process large quantities of data at high powers and high clock speeds.

Such work accelerators may be applied in so-called 'confidential compute' scenarios. That is, they may be provided with a workload from a host, where that workload may contain sensitive or confidential data. It is desirable to be able to reuse a work accelerator for different such workloads. In certain scenarios, for example if these workloads are not owned by the same entity, it is necessary to clear all confidential data from the accelerator before a new workload is provided to it.

The accelerator may comprise one or more processors. Data is retained in a processor in memory and/or registers. Registers are writable stores which are configured to hold data, normally on a temporary basis, while the processor is in operation. A so-called register file comprises multiple registers. Register files are located physically closer to a processing unit of the processor than main memory and can be closely coupled to that processing unit. Data can be written into the register file much more quickly than it can be written into main memory. Similarly, data may be recalled from the register file for use in the processing unit much more quickly than it can be recalled from main memory.

Register files can be used to store any kind of data. This can include operands provided with incoming instructions to the processing unit, operands recalled from main memory, addresses provided by instructions in the processing unit, addresses and pointers recalled from main memory, et cetera. Any data which can be stored in main memory may also be stored in register files. Some processers have register files dedicated for particular operations. For example, in the context of a multithreaded processing unit, each thread of operation may have its own context which is stored in its own register file.

In a confidential compute scenario, not only main memory but also register files need to be cleansed of any data that they may have temporarily stored before a next workload is to be provided to the processor. For this purpose, registers comprise a reset input. In a reset phase of operation, the reset input of the registers is activated and the data in the registers is cleansed (for example by writing it to a predetermined value such as all noughts or all ones).

SUMMARY

According to the present disclosure, a register file is provided without such reset inputs on the registers. A method of cleansing data in the registered files is described which does not require such reset inputs but which nevertheless reliably cleanses any data which may have been stored in the register files.

While the data cleansing operation is important for confidential compute applications, the provision of a reset input in the physical construction of each register in the register file causes the registers to be more complex. The ability to provide registers without such a reset input enables registers to be constructed which are more simple and take up less silicon footprint.

One aspect of the present disclosure provides a processing unit having a register file comprising:

a plurality of registers each having a write enable input configured to receive a write enable signal and a write data input connected to a write data path of the processing unit and configured to write data values from the write data path for storage in the register when the write enable signal is asserted;

write circuitry configured in a normal mode of operation to assert the write enable signal of a respective one of the registers to cause operational data values to be written to that register from the write data path; and data cleansing circuitry configured to control a data cleansing mode in which the write enable signals of all registers in the register file are simultaneously asserted to cause cleansing data values to be simultaneously written to all registers from the write data path.

In some embodiments, the processing unit comprises an execution unit configured to execute computer instructions, wherein in the normal mode of operation the write enable signal is provided by a computer executable instruction executed by the execution unit.

The processing unit may be configured to decode an address indicated by the computer executable instruction for generating the write enable signal.

The operational data values may be indicated by the computer executable instructions executed by the execution unit.

In some embodiments, the processing unit comprises a port configured to communicate with a host computer external of the processing unit.

The processing unit may be configured to receive data cleansing values from the host computer connected to the port and to apply the data cleansing values to the write data path.

In some embodiments, the processing unit is configured to receive a data cleansing mode signal from the host computer via the port, the data cleansing mode signal causing the write enable signal on all registers to be simultaneously asserted.

Another aspect of the present disclosure provides a computer system comprising a processing unit in communication with a host computer external of the processing unit, the processing unit having a register file comprising:

a plurality of registers each having a write enable input configured to receive a write enable signal and a write data input connected to a write data path of the processing unit and configured to write data values from the write data path for storage in the register when the write enable signal is asserted, write circuitry configured in a normal mode of operation to assert the write enable signal of a respective one of the registers to cause operational data values to be written to that register from the write data path, and data cleansing circuitry configured to control a data cleansing mode in which the write enable signals of all registers in the register file are simultaneously asserted to cause cleansing data values to be simultaneously written to all registers from the write data path;

wherein the host comprises storage configured to hold cleansing data values and configured to supply the cleansing data values with a data cleansing mode signal, the processing unit configured to receive the cleansing data values and to apply then to the write data path, and to use the data cleansing mode signal to simultaneously assert the write enable signal on all registers.

The storage may comprise a system on chip register.

Another aspect of the present disclosure provides a method of cleansing data in a register file of a processor connected to a host, the method comprising:

in a data cleansing mode, receiving at the processor a data cleansing mode signal and cleansing data values from the host, and applying the cleansing data values received from the host to a write data path connected to the write data input of each of a plurality of registers, wherein the data cleansing mode signal causes write enable signals of all registers in the register file to be simultaneously asserted to cause the cleansing data values to be simultaneously written to all registers from the write data path.

In a normal mode of operation, the method may comprise asserting the write enable signal of a respective one of the registers to cause operational data values to be written to that register from the write data path.

In some embodiments the method comprises decoding an address indicated by a computer executable instruction to be executed by the processor for generating the write enable signal in the normal mode of operation, wherein the operational data values are indicated by the computer executable instructions executed by the processor.

The write enable signals may be simultaneously asserted under the control of a clock signal which is provided from a clock which controls execution of computer executable instructions by the processor.

For a better understanding of the present invention and to show how the same may be carried into effect, reference will now be made by way of example to the following drawings.

DETAILED DESCRIPTION OF THE FIGURES

According to the present disclosure there is provided a register file comprising registers without reset inputs. This enables the register to be constructed from smaller flip-flops or latches which are capable of faster operation than those with reset inputs. Moreover, a technique is described for cleansing data stored in the register filed without the need for such reset inputs.

Figure 1:
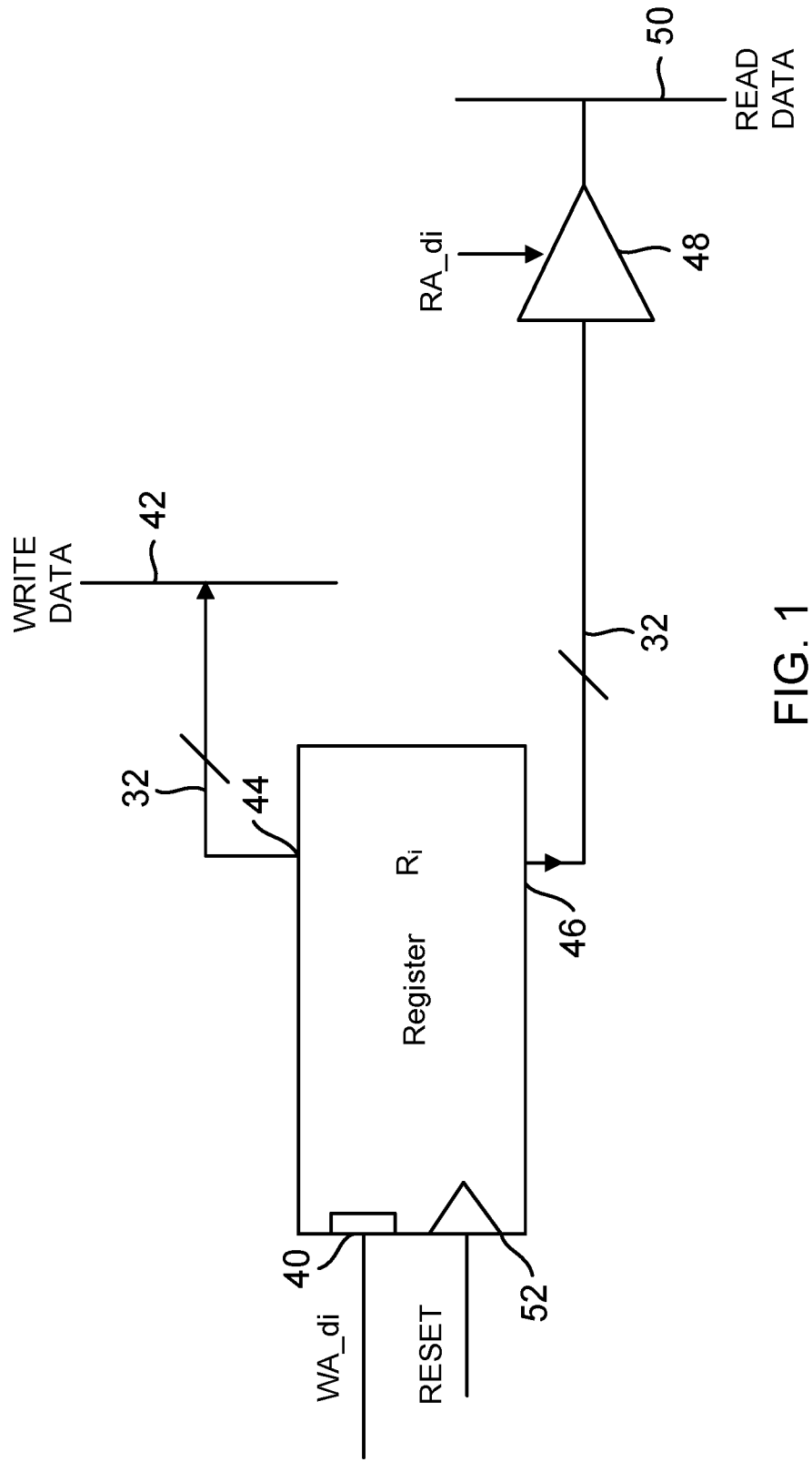
FIG. 1 is a schematic diagram of a register which has a reset input.

FIG. 1 shows an existing register construction in a simplified manner. A register Ri comprises a write enable input 40 which is configured to receive a decoded write address for writing data to the register. A register file may comprise multiple such registers, only one of which will have its write enable input 40 enabled at any given time, to allow data to be written to it. The data to be written to the register is provided on a write data bus 42. The width of the write data bus varies in different architectures, but can for example be 32 bits wide. When the write enable input 40 is activated for that particular register, the data on the write data bus 42 is written to the register file on write data input 44. A register may have one or more data read ports 46. Data may be read from that port via output tri-state buffers for example. Tri-state buffer 48 associated with the register Ri has a control input which, when activated, enables data to be transferred from the read port 46 to read data bus 50. The known register file construction shown in FIG. 1 comprises a reset input 52 for each register of the register file. The purpose of the reset input is to reset any data which has been stored in the register file when it is necessary to cleanse that data, for example to start a new operation or for the processor to receive a new workload. This is particularly useful in the context of confidential compute applications.

Figure 2:
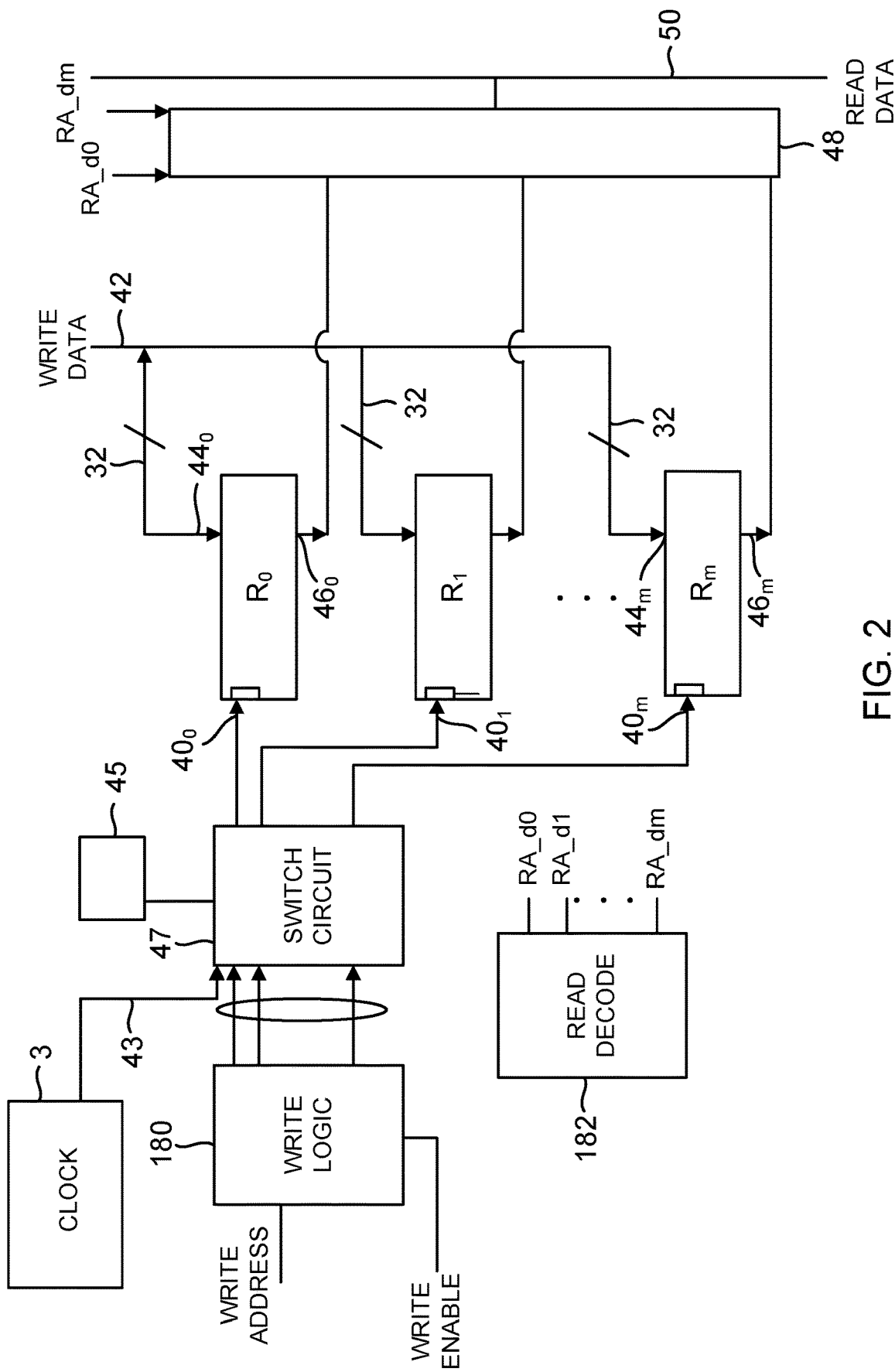
FIG. 2 is a schematic diagram of a register file comprising registers without reset inputs.

Reference will now be made to FIG. 2 to illustrate one example of a register file in which the individual registers do not have a reset input. Such a register file may be formed of cells accessed from a suitable library.

FIG. 2 shows an example register file comprising multiple such registers R0 . . . Rm. Each register has a write data port $40_0$ . . . $44m$ and a read data port $46_0$ . . . $46m$. Note that in practice there may be more than one read data port. Each register is associated with logic circuitry 48 which receives a decoded read address to determine from which register data is to be read on to the read data bus 50. Data is written from the write data bus 42. In normal operation, this is similar to the manner in which data is written in the register of FIG. 1. That is, each register has a write enable input $40_0$ . . . $40m$ which, when enabled, causes data on the write data bus to be written into that register. The write inputs are selectively enabled by write addresses supplied from write logic 180. Read addresses are supplied from read decode logic 182. Note that in FIG. 2 the connection between the read decode logic and the logic circuitry 48 are not shown for reasons of clarity.

As the registers do not each have a reset input, a different technique is required to cleanse the data from the registers when the process is to be used for a different workload, for example in the context of confidential compute applications. This is achieved by using a signal which causes all of the write enable inputs $40_0$ . . . $40_m$ of the registers to be activated at the same time. This signal may for example be the edge of a clock signal which is controlling operation of the processing unit. FIG. 2 illustrates a clock 3 which provides a clock signal 43 having rising and falling edges. In some embodiments the clock 3 also controls other functions, as described later. The clock signal 43 is supplied to one input of a switch circuit 47, which receives at other inputs the write addresses from write logic 180. A control value 45 is set in a register location as described later. The control value 45, which may be a single bit, controls the operation of the switch circuit 47. When the control value is set, the switch circuit 47 connects the clock signal 43 to the write enable input $40_0 \ldots 40_m$ of each register to cause all registers to read in data from the write data bus 42. Any cleansing data could be put on the write data bus. For example, all zeros or all ones could be supplied onto the write data bus to overwrite the existing data in all of the registers. The value written into the registers on reset is an implementation detail; it can change before a chip is committed to silicon. Once in silicon the value may be fixed.

Figure 3:
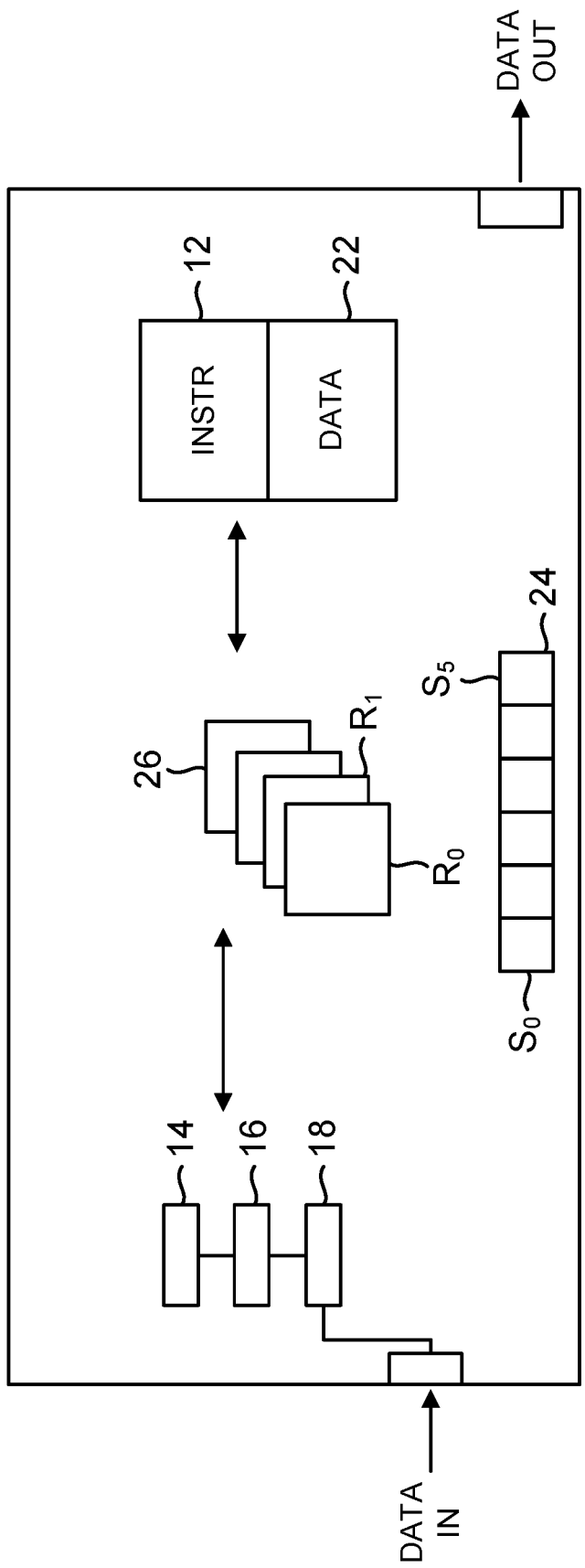
FIG. 3 is a schematic block diagram of a processing unit.

FIG. 3 illustrates an example processing unit in accordance with embodiments of the present disclosure. The processing unit may, in some embodiments, comprise a tile of a multi-tile processor as will be described below. In some embodiments, each tile comprises a processing pipeline for handling multiple threads of execution. It will be noted that the register cleansing techniques described herein are not restricted to this environment and can also be utilised with single thread execution environments. In the tile of the example of FIG. 3, multiple instruction threads are interleaved through a shared processing execution pipeline. Operation of the pipeline is controlled by the clock 3. The tile comprises a plurality of contexts 26 each arranged to represent the state of a different set of a plurality of threads; a shared instruction memory 12 common to the plurality of threads; a shared data memory 22 that is also common to the plurality of threads; a shared processing pipeline 14, 16, 18, that is again common to the plurality of threads; and a thread scheduler for scheduling the plurality of threads for execution through the shared pipeline in an interleaved manner.

The thread scheduler 24 is schematically represented in the diagram by a sequence of time slots $S_0 \ldots S_5$, but in practice, is a hardware mechanism managing program counters of the threads in relation to their time slots. The execution pipeline comprises a fetch stage 14, a decode stage 16, and an execution stage 18. Each of the contexts 26 comprises a respective set of registers $R_0 \ldots R_m$ for representing the program state of the respective thread. These registers may be implemented and controlled as described herein.

Figure 4:
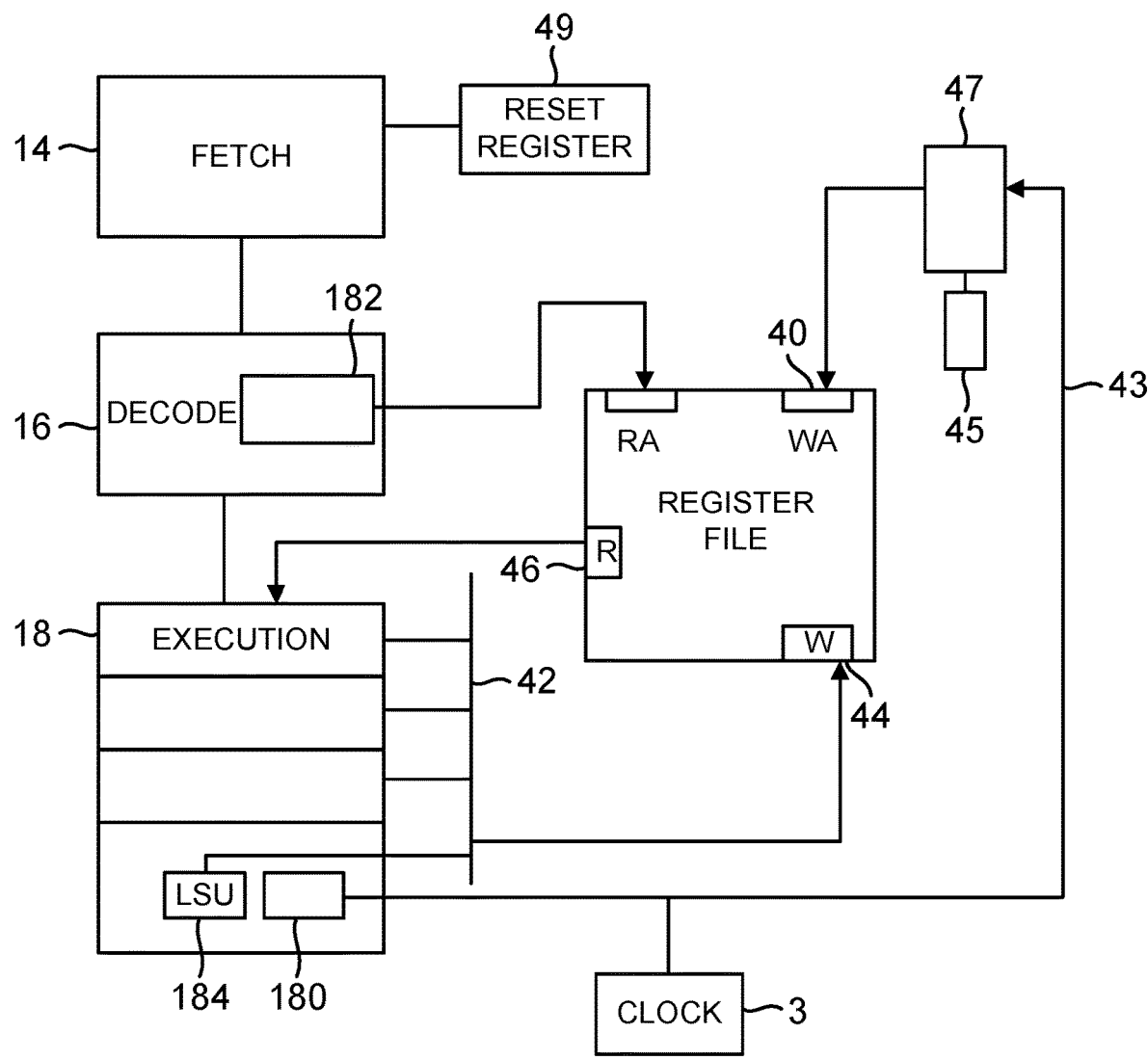
FIG. 4 is a schematic block diagram of a processing pipeline and register file within a processing unit.

FIG. 4 shows the relationship of each set of registers (register file) with the processing pipeline. The execution stage 18 of the processing pipeline may comprise multiple sub-stages for carrying out different execution operations, such as mathematical and accumulation operations. A final stage in the execution stages may be a load store stage. This comprises write logic 180 which controls the write address inputs of the register file. A load store unit 184 can supply data to be written on the write data bus 42 into the register file. Other stages in the pipeline may also be able to write values to the register file, for example arithmetic units in the execution pipeline.

In normal operation of the processing unit, a computer executable instruction is fetched from instruction memory 12 by the fetch stage 14 and supplied to the decode stage 16. In accordance with normal pipeline operation, while decode stage 16 is decoding the prior fetch instruction, the fetch stage may be fetching a next instruction. It will be appreciated that aspects of the present disclosure may be utilised in the context of a processing pipeline or in a processing unit which does not use pipelined processing.

The decode stage 16 comprises read decode logic 182 which can decode read addresses indicated in the decoded instruction to access data which has previously been stored to the register file. Such data may be read from the register file into the execution stage 18 of the execution pipeline from the read data ports 46. The execution stage operates on data read from the register file in accordance with the operation defined in the decoded instruction. The decode stage 16 is also responsible for decoding the instruction to extract the required operation. Each stage of the execution stages may be able to perform a different operation on the data which is read from the register file. In a final stage of the execution stages 18, the load store unit 184 holds a result of the operation which has been carried out in the processing pipeline ready to be stored back into the register file. The load store unit 184 is connected to the write data bus 42 for this purpose. Note that information on the write data bus will be written only into the register which is selected by the appropriate write address in normal operation. The write logic 180 controls the write address inputs of the register file so as to select the appropriate register to be written by data values from the load store unit in normal operation. Note that write logic may also be present in other pipeline stages and perform a similar function. The write address is indicated by the computer instruction. The write address might be identified at the decode stage. For example, an instruction may define a destination register into which an operational data value (a result of the instruction being executed) may be written. Alternatively, such a destination register may be implicit in the instruction. For example, a certain code in the instruction can indicate that a certain register number is always implied. In another manifestation, part of the operation of the instruction may be to access a memory address which itself indicates a register to act as a destination register. Note that this would be a multistage instruction which would itself have to utilise the register file. In any event, the register which is required to store the operational data value arising from operation of the instruction is indicated by the computer instruction executed by the processing pipeline in a normal mode of operation.

Figure 5:
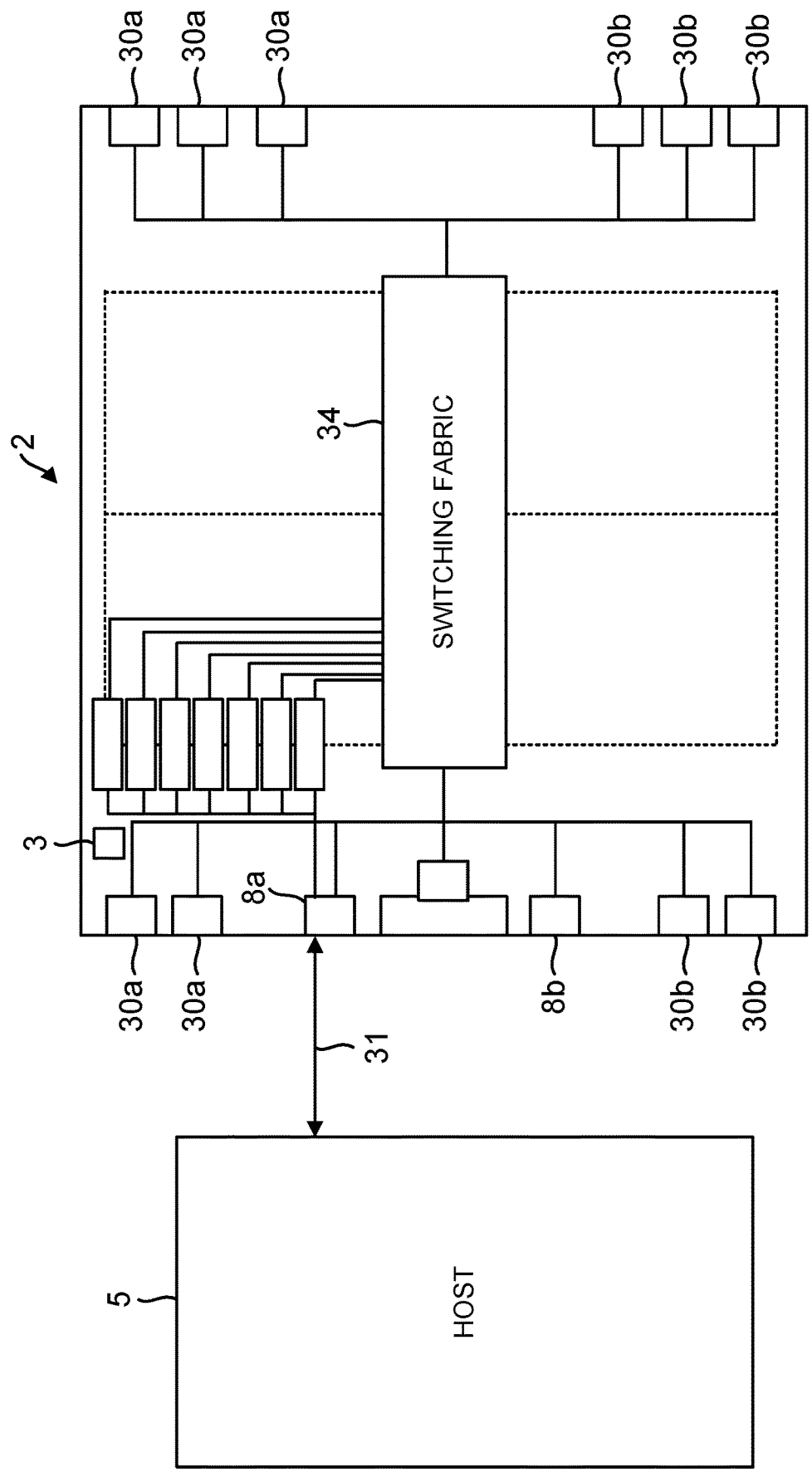
FIG. 5 is a schematic block diagram of processor comprising multiple processing units connected to a host.

A data cleansing mode of operation will now be described. In this data cleansing mode of operation, the register file is configured to operate in a different manner. In the data cleansing mode of operation, all registers of the register file are enabled to receive data from the write data path. That is, a write enable signal asserted at their write address ports activates all of the registers simultaneously to receive cleansing data values which are placed on the write data path. FIG. 5 illustrates an example processor comprising multiple processing units connected to a host 5. The host 5 determines that a data cleansing mode is to be triggered. For example, a data cleansing mode could be triggered when the processor is to be reset to receive a different workload. A data cleansing mode may be triggered when the processor is to be entirely cleansed and repurposed for a different application or a different owner. There are many reasons why a data cleansing mode may be triggered, and the above examples are not exhaustive.

When the host 5 triggers a data cleansing mode, it supplies data cleansing values to the processing unit. The host writes to a reset register 49 that resets the processor. The control value 45 is set which causes the register file cleansing to occur on the next rising clock edge of the clock 3.

The control value overrides the normal address decode logic 180 and forces all register banks of the register file to take the write data by switching the switch circuit 47 to pass through the clock signal 43.

For example, as indicated below and shown in in the example of FIG. 5, an input port 8a of the processor which is connected to the host may be utilised to implement reset. The data cleansing values which are stored internally to the or each processing unit are placed on the write data path.

The host 5 also supplies a data cleansing mode signal which is received at the or each processing unit and which causes the write enable signal to be asserted on the write address inputs of all registers of the register file simultaneously. This has the effect that cleansing data values on the write data bus are simultaneously written to all registers of the register file.

Cleansing data values may be held in a system on chip register in the or each processing unit. For example, they may be stored when the silicon is fabricated. Alternatively, they could be provided by the host or reprogrammed in when a new program is loaded into the processor.

While the processor comprises multiple processing units, they are all reset together. It is possible in some embodiments to select one or more of the processing units to be reset by the host, by causing the data cleansing mode signal from the host to be routed only to a group of one or more processing units.

The data cleansing values may be any suitable meaningless values. For example, they could be all noughts or all ones or randomised values.

Details of one particular work accelerator is given in the following by way of context. It will readily be appreciated however that the techniques described herein could be utilised in any situation where register files may need to be cleansed.

One such specialised work accelerator is a so-called intelligence processing unit (IPU) developed by Graphcore and described for example in U.S. Pat. Nos. 11,061,679 and 11,321,272. The contents of these applications are incorporated by references. In this architecture, a plurality of processing units are arranged in respective columns on a chip. The processor has an exchange fabric for exchanging messages between sending and receiving processing units in a so-called time deterministic fashion. That is, there is a fixed transmission time for transmitting a message from a sending processing unit to a receiving processing unit, based on the physical positions of the sending and receiving processing units.

The columns (and processing units within the columns) are arranged with respect to the exchange fabric such that the fixed transmission time depends on the distance of the processing circuits with respect to the exchange fabric. FIG. 5 illustrates schematically an example architecture of a single chip processor 2. Multiple single chip processors can be connected together using links on the chip to form a computer. Moreover, the single chip processor can be connected to a host via chip-to-host links as outlined below. The processor 2 comprises multiple processing units referred to as tiles. In one example, there are 1216 tiles organised in respective arrays on the chip. It would be appreciated that the concepts described herein extend to a number of different physical architectures—one example is given here to aid understanding. The chip 2 has two chip-to-host links 8a, 8b and four chip-to-chip links 30a, 30b. In the example of FIG. 5, the host 5 is shown connected to the chip to host links 8a and 8b over bi-directional links 31. The chip 2 receives work from the host 5. Note that the host 5 may operate with an accelerator which is architected as a single chip processor 2 as described herein or a group of multiple interconnected single chip processors 2 depending on the workload from the host application. To simplify FIG. 5, it is assumed here that the host is connected to a single chip 2. The chip 2 has a clock 3 which controls the timing of chip activity. The clock is connected to all of the chip circuits and components, although these connections are not shown in all the Figures for reasons of clarity. The chip 2 comprises an exchange fabric or interconnect 34 via which data can be exchanged between on chip tiles. The exchange is also available to transmit data and control signals on and off the chip, for example to and from the host. The reset signal which triggers data cleansing mode may also be routed through the exchange 34 however it is a dedicated signal and follows a path separate from data on the exchange. The reset signal is connected to the reset register 49 which may be located in the chip's periphery. The host may execute software to write to the reset register 49 and set the control value 45 via PCIe commands over the links in the periphery.

While particular embodiments have been described, other applications and variants of the disclosed techniques may become apparent to a person skilled in the art once given the disclosure herein. The scope of the present disclosure is not limited by the described embodiments but only by the accompanying claims.

The invention claimed is:

1. A computer system comprising:
   a processing unit having a register file including:
      a plurality of registers each having a write enable input and a write data input, wherein the write enable input is configured to receive a respective write enable signal of a plurality of write enable signals, wherein the write data input is connected to a write data path of the processing unit and configured to write a plurality of data values from the write data path into the register in response to the respective write enable signal,
      write circuitry configured in a first mode of operation to assert the write enable signal of a first register to cause a set of operational data values to be written to the first register from the write data path, and
      data cleansing circuitry configured to control a second mode of operation in which the write enable signals of all registers in the register file are simultaneously asserted to cause cleansing data values to be simultaneously written to all registers in the register file from the write data path;
   wherein the processing unit is configured to apply the cleansing data values to the write data path and to simultaneously assert the plurality of write enable signals on all registers in the register file; and
   a host computer external of the processing unit, wherein the host computer includes storage configured to hold the cleansing data values and configured to supply the cleansing data values with a mode signal to the processing unit.

2. The computer system of claim 1, wherein the storage comprises a system on chip register.

3. The computer system of claim 1, further comprising an execution unit, wherein in the first mode of operation the write enable signal of the first register is provided by a computer executable instruction executed by the execution unit.

4. The computer system of claim 3, wherein the operational data values are indicated by the computer executable instruction executed by the execution unit.

5. A method of cleansing data in a register file of a processor connected to a host computer, the method comprising:
   in a first mode of operation, receiving at the processor a mode signal and a set of cleansing data values from the host computer, and
   applying the set of cleansing data values to a write data path coupled to a plurality of write data inputs of a plurality of registers in the register file,
   wherein the mode signal causes write enable signals of all registers in the register file to be simultaneously asserted to cause the cleansing data values to be simultaneously written to all registers in the register file from the write data path, the method further comprising:

in a second mode of operation, executing a computer executable instruction by the processor, including generating operational data values to be written to the registers, and asserting a first one of the write enable signals to cause the operational data values to be written from the write data path to a first one of the registers.

6. The method of claim 5, further comprising: decoding an address indicated by a computer executable instruction to be executed by the processor for generating the write enable signals in the second mode of operation.

7. The method of claim 5, wherein the write enable signals are simultaneously asserted under control of a clock signal.

8. The method of claim 7, further comprising: providing the clock signal from a clock which controls execution of computer executable instructions by the processor.

9. The method of claim 5, further comprising: decoding a first address for generating a first one of the write enable signals in the second mode of operation.

\* \* \* \* \*